(12) United States Patent
Kim et al.

(10) Patent No.: US 7,672,547 B2
(45) Date of Patent: Mar. 2, 2010

(54) PRINTED CIRCUIT BOARD INCLUDING OPTICAL WAVEGUIDE AND METHOD OF MANUFACTURING THE SAME

(75) Inventors: Sang Hoon Kim, Gyunggi-do (KR); Je Gwang Yoo, Gyunggi-do (KR); Joon Sung Kim, Gyunggi-do (KR); Jae Hyun Jung, Gyunggi-do (KR); Han Seo Cho, Daejeon (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 0 days.

(21) Appl. No.: 12/216,995

(22) Filed: Jul. 14, 2008

(65) Prior Publication Data

US 2009/0290832 A1    Nov. 26, 2009

(30) Foreign Application Priority Data

May 23, 2008    (KR) .................... 10-2008-0048202

(51) Int. Cl.
*G02B 6/12*    (2006.01)
*H01L 21/00*    (2006.01)

(52) U.S. Cl. .......................................... 385/14; 438/31
(58) Field of Classification Search ..................... None
See application file for complete search history.

(56) References Cited

U.S. PATENT DOCUMENTS

| 6,706,546 | B2 * | 3/2004 | Yoshimura et al. ............ 438/31 |
| 6,996,305 | B2 * | 2/2006 | Kim et al. .................... 385/15 |
| 7,327,022 | B2 * | 2/2008 | Claydon et al. ............. 257/689 |
| 7,330,612 | B2 * | 2/2008 | Nakashiba et al. ............ 385/14 |
| 7,349,614 | B2 * | 3/2008 | Doan ......................... 385/131 |
| 7,466,880 | B2 * | 12/2008 | Windover .................... 385/14 |
| 2009/0016671 | A1 * | 1/2009 | Asai et al. .................... 385/14 |

* cited by examiner

*Primary Examiner*—Omar Rojas

(57) ABSTRACT

A printed circuit board including an optical waveguide and a method of manufacturing the board. In the board, the optical waveguide includes a metal layer extending portion integrally connected to a metal layer constituting a mirror formed in the optical waveguide. Since the method creates the mirror using electroless plating, which is typically used in a process of manufacturing general printed circuit boards, it is suitable for the manufacture of printed circuit boards having a large area, and the mirror has high reflectivity and is efficient in terms of material consumption.

16 Claims, 8 Drawing Sheets

FIG. 1A – Prior Art
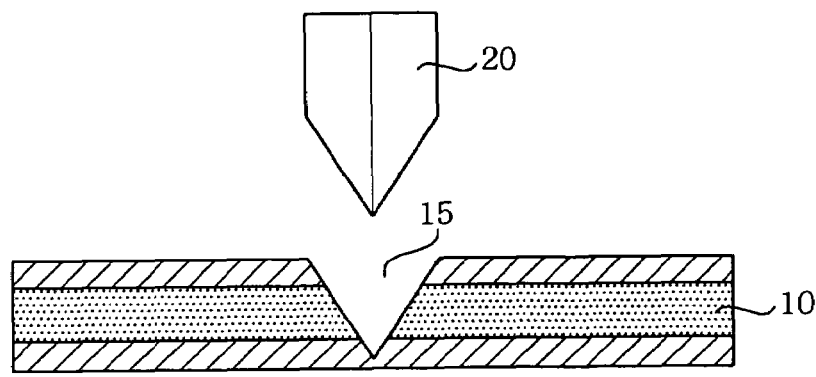
FIG. 1B – Prior Art
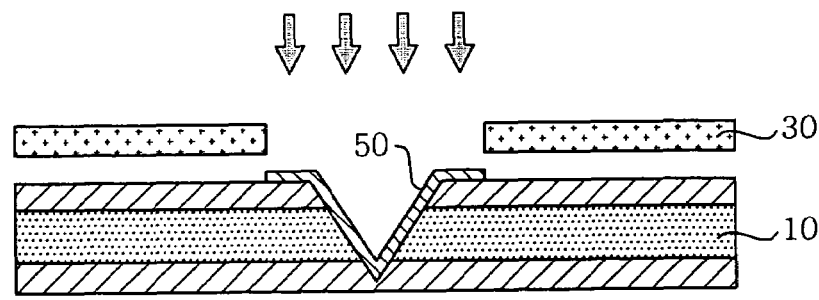
FIG. 1C – Prior Art
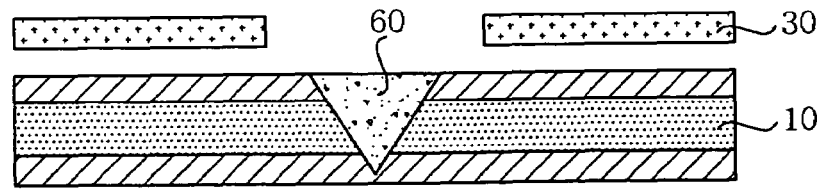

FIG.2A — Prior Art
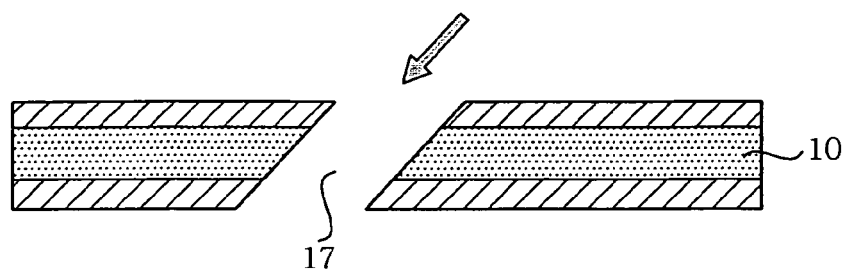
FIG.2B — Prior Art
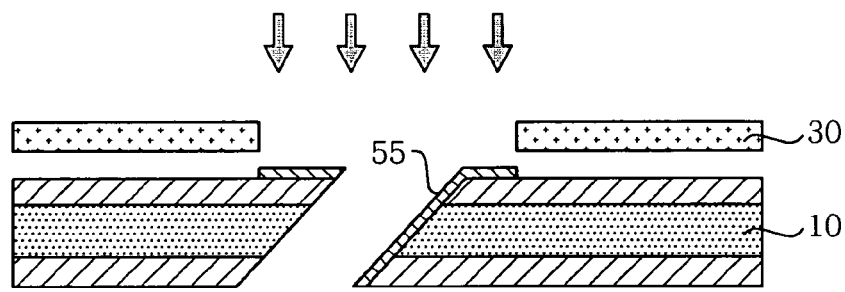
FIG.2C — Prior Art
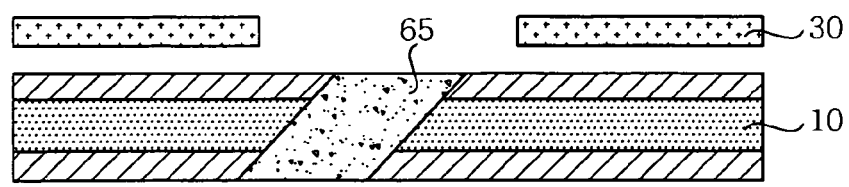

PRINTED CIRCUIT BOARD INCLUDING OPTICAL WAVEGUIDE AND METHOD OF MANUFACTURING THE SAME

CROSS REFERENCE TO RELATED APPLICATION

This application claims the benefit of Korean Patent Application No. 10-2008-0048202, filed May 23, 2008, entitled "PRINTED CIRCUIT BOARD INCLUDING OPTICAL WAVEGUIDE AND METHOD OF MANUFACTURING THE SAME", which is hereby incorporated by reference in its entirety into this application.

BACKGROUND OF THE INVENTION

1. Field of the Invention

The present invention relates generally to a printed circuit board including an optical waveguide and a method of manufacturing the printed circuit board, and, more particularly, to a printed circuit board including an optical waveguide, which has a metal layer extending portion integrally connected to a metal layer constituting a mirror formed on the optical waveguide.

2. Description of the Related Art

In electronic elements, the development of existing printed circuit board technology employing copper-based electrical wiring has almost reached the limit of its ability to support increases in the speed of data processing as well as increased data capacity. Accordingly, as a technology for overcoming the problems occurring in copper-based electrical wiring, printed circuit boards that include optical wiring are receiving a lot of attention.

A printed circuit board including optical wiring, in which an optical waveguide capable of sending and receiving signals using light transmitted along polymer or optical fibers is incorporated, is referred to as an "EOCB (Electro-Optical Circuit Board). EOCBs are being extensively applied to backplanes and daughterboards used for communications in the aerospace industry and aviation electronics, base transceiver stations of UMTS (Universal Mobile telecommunication Systems), supercomputers, and the like.

In order to manufacture a printed circuit board including optical wiring, a mirror for diverting a light path must be provided in the printed circuit board.

FIGS. 1A to 1C and FIGS. 2A to 2C shows processes of forming a mirror in optical wiring according to conventional technologies.

FIGS. 1A to 1C are cross-sectional views showing the mechanical process of forming the mirror. As shown in FIG. 1A, a mirror notch 15 is formed in optical wiring 10 using a dicing blade 20. Thereafter, a gold (Au) layer is deposited on the mirror notch 15 through a mask 30 using a sputtering process, thus forming a mirror 50, as shown in FIG. 1B, or metal paste is charged in the mirror notch 15 through a mask 30 using a printing process, thus forming a mirror 60, as shown in FIG. 1C.

FIGS. 2A and 2C are cross-sectional views showing an optical process of forming a mirror. As shown in FIG. 2A, an excimer laser is radiated onto optical wiring 10 in the direction of an arrow, so as to form a mirror hole 17 therein. Thereafter, a gold (Au) layer is deposited on the inner wall of the mirror hole 17 through a mask 30 using a sputtering process, thus forming a mirror 55, as shown in FIG. 2B, or metal paste is charged in the mirror hole 17 through a mask 30 using a printing process, thus forming a mirror 65, as shown in FIG. 2C.

However, the conventional metal sputtering process has disadvantages in that, in the case of manufacturing an optical substrate having a large area, the amount of metal material consumed per unit coating area is relatively large, and in particular, the use of gold particles incurs high costs.

Similarly, the conventional printing process using metal paste also has disadvantages in that it fundamentally consumes a large amount of material and it is difficult to achieve even reflection on the boundary faces of the mirror. In order to assure even reflections on the boundary faces of the mirror, the metal paste must include a large amount of high reflective nanosized metal particles having uniform size distribution, thus causing an increase in the manufacturing costs.

SUMMARY OF THE INVENTION

Accordingly, the present invention has been made keeping in mind the above problems occurring in the prior art, and the present invention provides a printed circuit board including an optical waveguide having a mirror formed thereon and a method of manufacturing the printed circuit board, which is suitable for the manufacture of large area substrates, maintains high reflectivity, and is efficient in view of material consumption. In one aspect, the present invention provides a printed circuit board including an optical waveguide, including: a mirror for reflecting optical signals, which is formed in the optical waveguide and is comprised of a metal layer; a first laminate formed on a side of the optical waveguide and including a first insulating layer having a first through-hole through which a reflecting surface of the mirror is exposed; a second laminate including a second insulating layer formed on the other side of the optical waveguide; and a metal layer extending portion formed on an inner wall of the first through-hole and integrally connected to the metal layer.

The optical waveguide may include clads and a core disposed between the clads to transmit optical signals.

The second insulating layer may be made of a transparent insulating material.

Each of the first and second laminates may be a single-sided or multilayered printed circuit board.

The second laminate may include a second through-hole formed at a region corresponding to the first through-hole so as to allow optical signals to enter and exit therethrough.

The printed circuit board may further include solder resist layers, which are respectively formed on the first laminate, having the first through-hole therein, and the second laminate.

The solder resist layer formed on the second laminate may include a through-hole formed at a region corresponding to the first through-hole so as to allow optical signals to enter and exit therethrough.

The printed circuit board may further include an insulating resin layer formed on the first laminate including the first through-hole, and a circuit pattern formed on the insulating resin layer.

Each of the metal layer and the metal layer extending portion may include an electroless plating layer.

In another aspect, the present invention provides a method of manufacturing a printed circuit board including an optical waveguide, including: preparing an optical waveguide having a mirror notch, which comprises a first laminate including a first insulating layer formed on a side of the optical waveguide and a second laminate including a second insulating layer formed on the other surface of the optical waveguide, in which the first insulating layer has a first through-hole through which the mirror notch is exposed; and providing the mirror notch with a metal layer serving as a mirror surface for reflecting optical signals.

The providing the mirror surface may include conducting electroless plating on inner walls of the first through-hole and the mirror notch.

The method may further include, prior to the providing the mirror surface, conducting a chemical or plasma pretreatment on an inner walls of the first through-hole and the mirror notch so as to improve plating properties.

The preparing the optical waveguide includes: providing the optical waveguide; placing the first laminate, including the first insulating layer having the first through-hole, on the one side of the optical waveguide, and placing the second laminate, including the second insulating layer, on the other side of the optical waveguide; and forming the mirror notch in a portion of the optical waveguide that is exposed through the first through-hole.

The preparing the optical waveguide may include: forming the mirror notch in the optical waveguide; and placing the first laminate, including the first insulating layer having the first through-hole through which the mirror notch is exposed, on the one side of the optical waveguide, and placing the second laminate, including the second insulating layer, on the other side of the optical waveguide.

Each of the first and second laminates may be a single-sided or multilayered printed circuit board.

The second insulating layer may be made of a transparent insulating material.

After the providing the mirror surface, the method may further including forming solder resist layers on the first and second laminates such that the mirror notch and the first through-hole communicating with the mirror notch are filled with the solder resist layer.

After the providing the mirror surface, the method may further including forming a solder resist layer on the first laminate such that the mirror notch and the first through-hole communicating with the mirror notch are filled with the solder resist layer.

BRIEF DESCRIPTION OF THE DRAWINGS

The above and other objects, features and other advantages of the present invention will be more clearly understood from the following detailed description taken in conjunction with the accompanying drawings, in which:

FIGS. 1A to 1C are cross-sectional views showing a conventional mechanical process of forming a mirror in an optical waveguide;

FIGS. 2A to 2C are cross-sectional views showing a conventional optical process of forming a mirror in an optical waveguide;

DESCRIPTION OF THE PREFERRED EMBODIMENTS

Figure 3A:
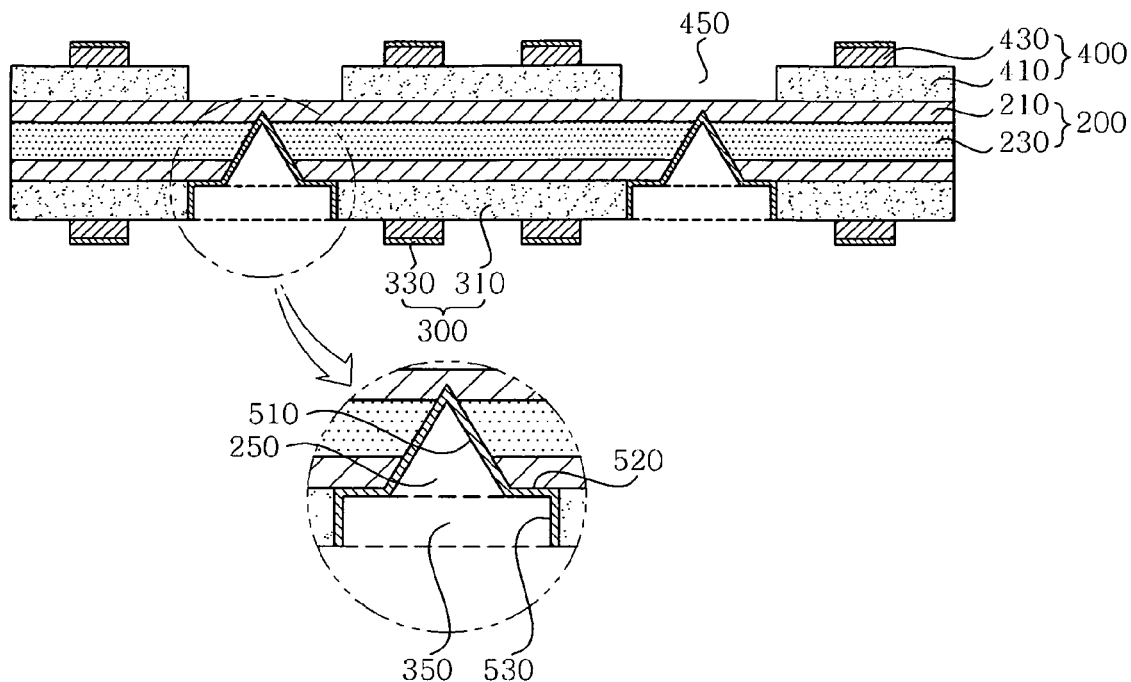
FIGS. 3A and 3B are cross-sectional views of printed circuit boards, each of which includes an optical waveguide, according to an embodiment of the present invention.

Hereinafter, a printed circuit board including an optical waveguide and a method of manufacturing the printed circuit board according to the present invention will be described in greater detail with reference to the accompanying drawings. Throughout the accompanying drawings, the same reference numerals are used to designate the same or similar components, and redundant descriptions thereof are omitted. In the following description, the terms "first", "second" and the like are used to differentiate a certain component from other components, but the components should not be construed to be limited to the terms.

FIG. 3A is a cross-sectional view of a printed circuit board including an optical waveguide, according to an embodiment of the present invention. As shown in FIG. 3A, the present invention is configured such that a metal layer, which constitutes a mirror 510 for reflecting optical signals, is integrally connected to a metal layer extending portion 530.

More specifically, the printed circuit board according to this embodiment of the present invention comprises an optical waveguide 200, a mirror 510, which is adapted to reflect optical signals, is formed in the optical waveguide 200, and is made of a metal layer, a first laminate 300, which includes a first insulating layer 310, is formed on a side of the optical waveguide 200, and has therein a first through-hole 350, through which a reflective surface of the mirror 510 is exposed, a second laminate 400, including a second insulating layer 410 formed on the other side of the optical waveguide 200, and a metal layer extending portion 530, formed on the inner wall of the first through-hole 350 and integrally connected to the metal layer constituting the mirror 510.

The optical waveguide 200 comprises clads 210 and a core 230 disposed between the clads 210 for optical signal transmission.

The clads 210 are configured to surround the core 230 such that optical signals are efficiently transmitted through the core 230, and serve as a usual insulating layer of a circuit layer. The clads 210 are made of polymer material. The core 230 is disposed between the clads 210 and serves as a path along which optical signals are transmitted. The core 230 is also made of polymer material, and has a refractive index higher than that of the clads 210 for the effective transmission of optical signals.

The mirror 510 for reflecting optical signals is positioned in each of a pair of mirror notches 250 formed in the optical waveguide 200, and functions to change the direction of an optical signal to allow the optical signal to be transmitted along the core 230. The mirror 510 is comprised of a metal layer formed in the notch. In this embodiment, the mirror 510 is comprised of an electroless metal plating layer.

When an optical signal is incident on the mirror 510 in a direction perpendicular to the transmitting direction of the optical signal of the core 230, the mirror 510 for reflecting optical signals includes a mirror plane, which is inclined at an angle of about 45 degrees with respect to the optical signal direction of the core 230. The mirror 510 reflects light, which is incident thereon from an optical transmitter (not shown), in a direction perpendicular to the incident direction of the light, thus transmitting the light along the core 230, while further reflecting the reflected light in a direction perpendicular to the incident direction of the light, thus transmitting the light to an optical receiver (not shown).

In this embodiment, although the mirror 510 is shown as having an inverted "V"-section, the present invention is not limited to the printed circuit board including the mirror 510 having the inverted "V"-section, and any mirrors having a reflecting surface are applicable to the present invention. The metal layer constituting the mirror may be made of materials such as copper and nickel, which are generally used in the manufacture of printed circuit boards.

The first laminate 300 includes the first insulating layer 310, which is formed on the surface of the optical waveguide 200, and the first through-hole 350, through which the reflecting surface of the mirror 510 is exposed. Referring to FIG. 3A, the first laminate 300 according to this embodiment has the first through-hole 350, which communicates with the mirror notch 250 and thus exposes the mirror notch 250. Positioned on the inner wall of the first through-hole 350 is the metal layer extending portion 530, which is integrally connected to the metal layer, which constitutes the mirror 510. The metal layer extending portion 530 results from the execution according to a manufacturing process, which will be described later, in which the first laminate 300 is formed on the optical waveguide 200 and then the mirror 510 is formed. Although there is shown a connecting portion 520 which is disposed between the metal layer and the metal layer extending portion 530 and along the clad 210, a configuration lacking the connecting portion 520 is also possible. In other words, the first through-hole 350 may be configured to be aligned with the mirror notch 250, so as to eliminate the use of the connecting portion 520.

Figure 5:
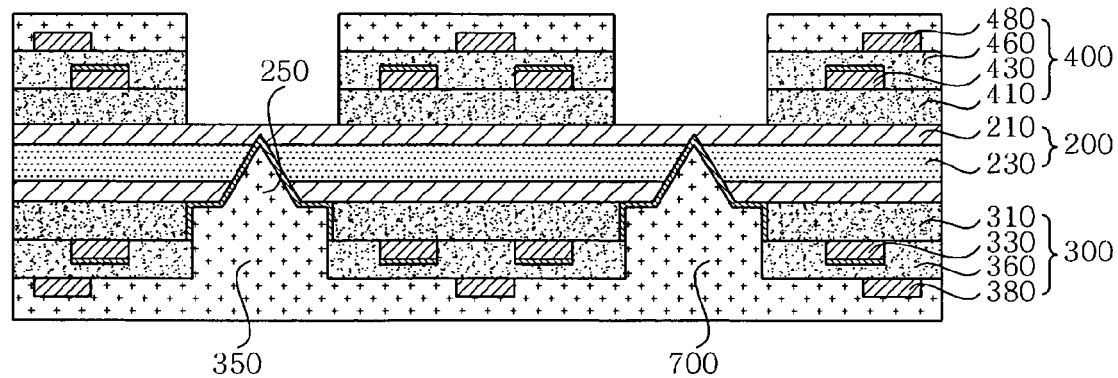
FIG. 5 is a cross-sectional view of a printed circuit board which includes first and second laminates, each of which includes two circuit layers, and solder resist layers formed on outer layers thereof.
Figure 6:
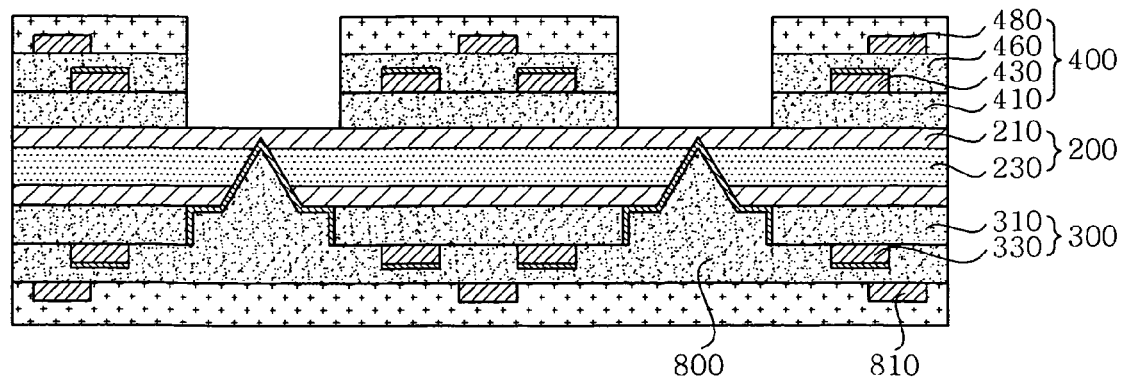
FIG. 6 is a cross-sectional view of a printed circuit board, in which a mirror notch and a first through-hole are filled with an insulating resin layer and solder resist layers are formed thereon.

Referring to FIG. 3A, in this embodiment, a single-sided printed circuit board, which is comprised of the first insulating layer 310 and the circuit layer formed on the first insulating layer 310, is employed as the first laminate 300. However, the first laminate 300 used in the printed circuit board according to this embodiment is not limited to this configuration, and a multilayered printed circuit board, which further includes a third insulating layer 360 and a third copper layer 380 and is adapted to transmit electric signals, as illustrated in FIGS. 5 and 6, may also be used. More specifically, the printed circuit board according to the present invention is not restricted to the number of circuit layers incorporated in the first laminate 300, and changing the number of circuit layers incorporated in the first laminate 300 is no more than a simple modification.

The second laminate 400 is configured to include the second insulating layer 410, which is formed on the surface of the optical waveguide 200 located opposite the surface on which the first laminate 300 is formed. As shown in FIG. 3A, the second laminate 400 has a second through-hole 450 formed at a position corresponding to the first through-hole 350 of the first laminate 300, which allows optical signals to enter and exit therethrough. However, the present invention is not limited to this configuration. Alternatively, in the case in which the second insulating layer 410 is comprised of transparent insulating material which allows optical signals to be transmitted therethrough, the second through-hole 450 may be obviated, as shown in FIG. 3B.

Figure 3B:
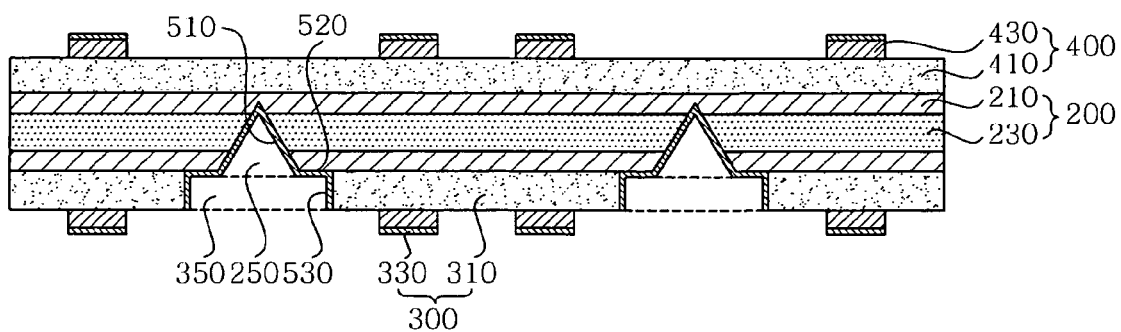

In the embodiment shown in FIGS. 3A and 3B, although a single-sided printed circuit board in which a circuit layer is formed on the second insulating layer 410 is employed as the second laminate 400, the present invention is not limited to this configuration. Alternatively, a multilayered printed circuit board, which further includes a fourth insulating layer 460 and a fourth copper layer 480 and is adapted to transmit electric signals, as shown in FIGS. 5 and 6, may also be used, as in the case of the first laminate 300, and may not have the same number of layers as the first laminate 300.

Figure 4:
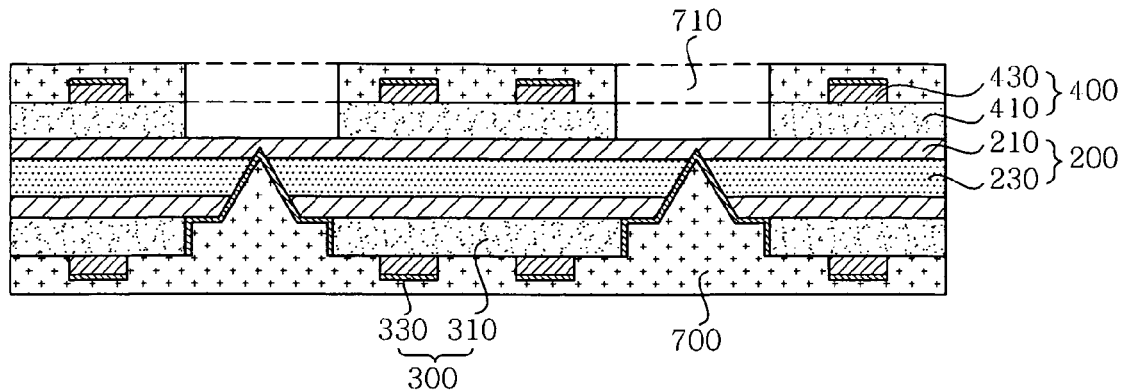
FIG. 4 is a cross-sectional view of a printed circuit board which is manufactured by additionally providing solder resist layers on outer layers of the printed circuit board shown in FIG. 3A.

As shown in FIGS. 4 and 5, the printed circuit board according to this embodiment may further include a solder resist layer 700, which is formed on the first laminate 300, including the first through-hole 350, and the second laminate 400. The solder resist layer 700 functions to protect outer circuit layers of the first and second laminates 300 and 400 and the mirror 510. In this case, the solder resist layer 700 formed on the second laminate 400 has a through-hole 710 formed at a region corresponding to the first through-hole 350 so as to allow optical signals to enter and exit therethrough.

As shown in FIG. 6, the printed circuit board according to this embodiment may further include a first insulating resin layer 800, formed on the first laminate 300 having the first through-hole 350, and a circuit pattern may be formed on the first insulating resin layer 800. In this case, it is of course possible to include the solder resist layer 700 for protecting the circuit pattern formed on the first insulating resin layer 800 and the outer layer of the second laminate 400.

Since the printed circuit board including an optical waveguide according to this embodiment of the present invention includes the mirror 510, which is made of a metal plating layer, it is advantageous in that the manufacturing costs of the mirror 510 are reduced and the mirror 510 can be manufactured through a simple process.

A process of manufacturing the printed circuit board including an optical waveguide according to an embodiment of the present invention will now be described. FIGS. 7 to 16 are flow process views sequentially showing the process of manufacturing the printed circuit board including an optical waveguide, according to the embodiment of the present invention.

Figure 7A:
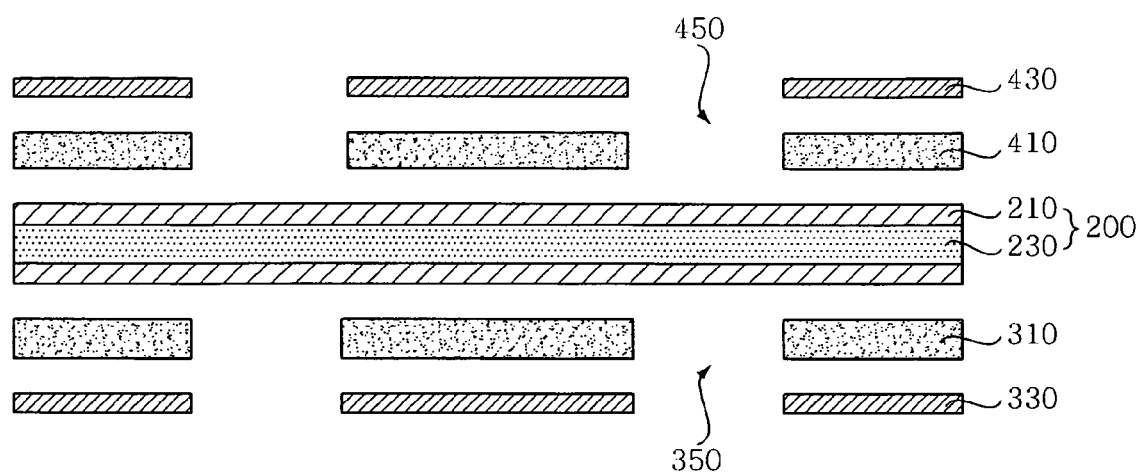
FIGS. 7A to 13 are flow process views sequentially showing a process of manufacturing a printed circuit board including an optical waveguide, according to an embodiment of the present invention.
Figure 7B:
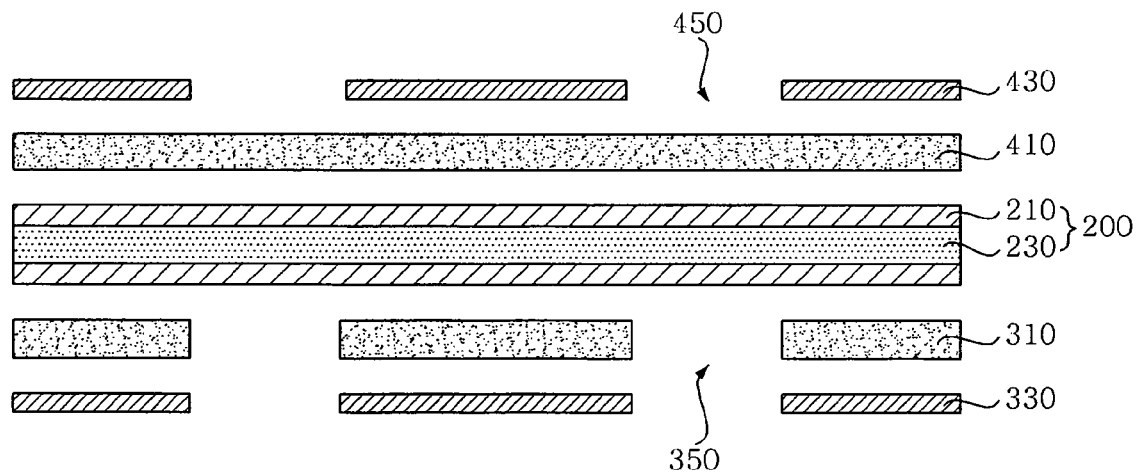

As shown in FIG. 7A, an optical waveguide 200 comprised of clads 210 and a core 230, a first insulating layer 310, a first copper layer 330, in which a first through-hole 350 is formed in both the first insulating layer 310 and the first copper layer 330, a second insulating layer 410, and a second copper layer 430, in which a second through-hole 450 is formed in both the second insulating layer 410 and the second copper layer 430, are separately prepared. Specifically, the optical waveguide 200 is disposed between the first insulating layer 310 and the second insulating layer 410, the first copper layer 330 is placed on the first insulating layer 310, and the second copper layer 430 is placed on the second insulating layer 410. The second through-hole 450 is formed at a region corresponding to the first through-hole 350. In this case, when the second insulating layer 410 is made of transparent insulating material, a process of creating the second through-hole 450 in the second insulating layer 410 may be omitted, as shown in FIG. 7B.

Meanwhile, instead of the above manner, in which separate copper layers and insulating layers are layered together, a material such as FCCL (Flexible Copper Clad Laminate), in which copper layers and insulating layers are layered in advance, may also be used.

Further, although the process according to this embodiment includes layering the first copper layer 330 and the second copper layer 430 to form circuit layers on the first and second insulating layers 310 and 410 using a subtraction process, the layering of the first and second copper layers 330 and 430 may be omitted in the case in which the circuit layers are formed on the first and second insulating layers 310 and 410 using an additive process including a semi-additive process and a modified semi-additive process.

Figure 8:
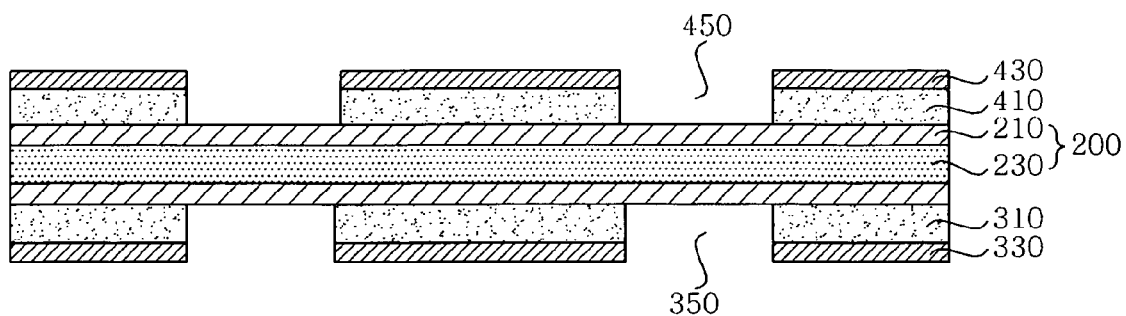

As shown in FIG. 8, the optical waveguide 200, the first insulating layer 310, the first copper layer 330, the second insulating layer 410 and the second copper layer 430 are layered together.

Figure 9:
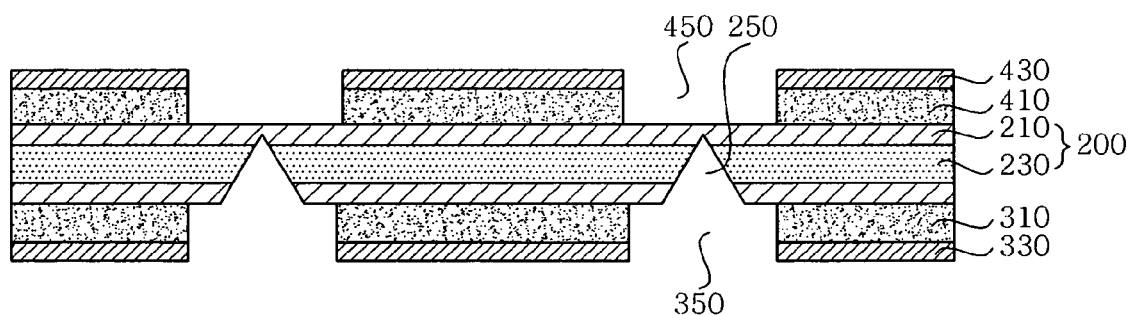

Thereafter, as shown in FIG. 9, a mirror notch 250 is formed in the optical waveguide 200, which is exposed through the first through-hole 350. In this embodiment, the mirror notch 250 may be formed using a dicing blade. However, the process of machining the mirror notch is not limited to the above-described manner, and the mirror notch 250 may be formed using any of known processes. Further, the mirror notch may be formed as a hole rather than a groove, and the mirror having the hole is to be understood as falling within the scope of the present invention.

Figure 10:
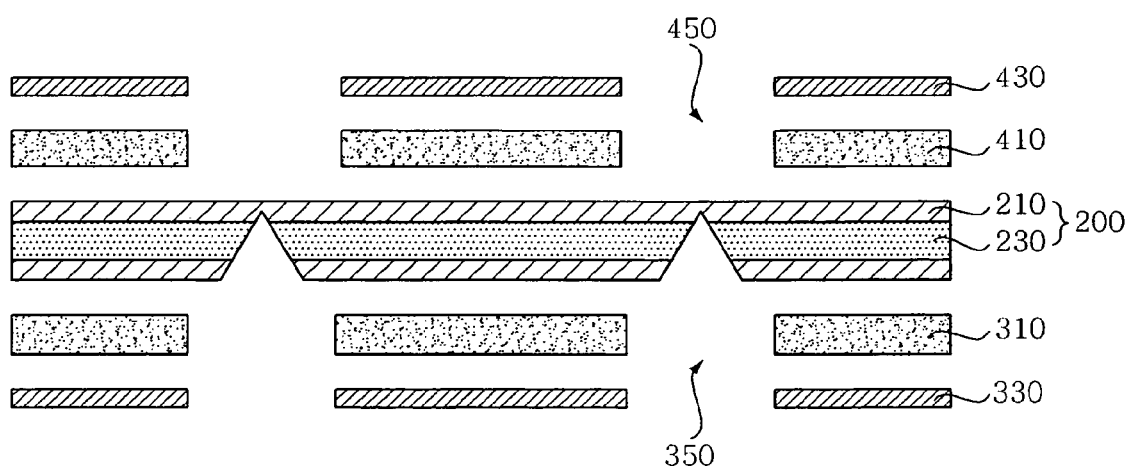

Although the process according to this embodiment is described as being conducted in a manner such that the mirror notch 250 is formed after the layering of the first and second insulating layers 310 and 410, the process is not limited to this manner. Alternatively, as shown in FIG. 10, the process may be conducted in a manner such that the mirror notch 250 is previously formed in the optical waveguide 200 and then the first and second insulating layers 310 and 410 are layered, or such that only either one of the first and second insulating layers 310 and 410 is formed and then the mirror notch 250 is formed.

Figure 11:
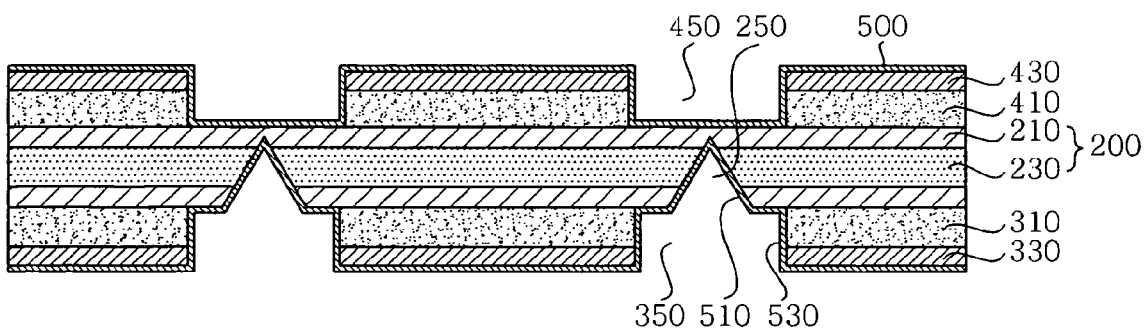

Subsequently, as shown in FIG. 11, an electroless panel plating process is conducted on the exposed surface of the printed circuit board, including the inner walls of the mirror notch 250 and the first through-hole 350, which has been prepared in the above manner, so that an outer metal layer 500 is formed, which includes a metal layer constituting the mirror 510 and a metal layer extending portion 530 which is formed on the inner wall of the first through-hole 350 and is integrally connected to the metal layer of the mirror 510. The outer metal layer 500 may be made of any of material, such as copper and nickel, which are generally used in the manufacture of printed circuit boards. Further, the outer metal layer 500 may be made of any material as long as the material has sufficiently high reflectivity, because chemical plating particles on the contact surface of the mirror have a uniform size distribution and are very small.

In this case, prior to the electroless panel plating process, chemical or plasma pretreatment may be conducted in order to improve plating properties. Optionally, after the electroless panel plating process, an electroplating process may be conducted using the outer metal layer 500 as a lead-in wire.

The reason why the first through-hole 350 and the mirror notch 250 are simultaneously plated may be explained as follows. Similar to polyimide film, the material constituting the optical waveguide is characterized in that it permits stable chemical copper plating thereon when having a small plating area while it is impossible to realize stable plating when having a large area, in particular when having liquid-flowability, as in when plating substrates.

Accordingly, this embodiment is designed such that only the mirror notch 250, rather than the entire optical waveguide, is exposed through the first through-hole to reduce the plating area, thus allowing stable electroless plating on the mirror notch 250.

Figure 12:
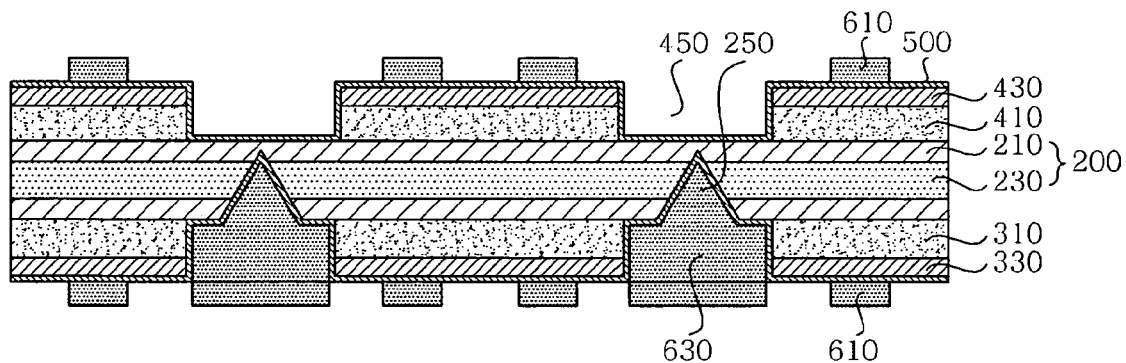

As shown in FIG. 12, the mirror notch 250 and the first through-hole 350 are filled with liquid resist 630, and resist layers 610 are formed on the first and second copper layers 330 and 430 and then patterned into a desired circuit shape. Here, the mirror notch 250 and the first through-hole 350 may not be filled with the liquid resist 630, if required. In this case, the first through-hole 350 must be plugged by the patterns of the resist layers 610 so that the metal layer constituting the mirror 510 is not etched using an etchant.

Figure 13:
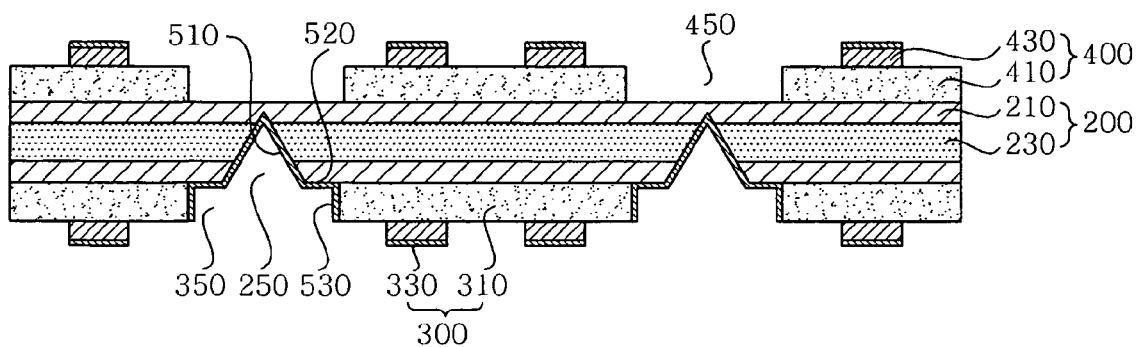

As shown in FIG. 13, an etching process is conducted so as to remove the portions of the outer metal layer 500, the first copper layer 330 and the second copper layer 430 on which the patterns of the resist layers 610 are not formed.

As a result of conduction of the above-described process, the printed circuit board, which comprises the optical waveguide 200, a mirror 510 formed in the optical waveguide 200 and made of a metal layer, the first laminate 300, which includes the first insulating layer 310 formed on the surface of the optical waveguide 200 and has the first through-hole 350, through which the reflecting surface of the mirror 510 is exposed and the circuit layer formed on the first insulating layer 310, the second laminate 400, which includes the second insulating layer 410 formed on the other surface of the optical waveguide 200 and the circuit layer formed on the second insulating layer 410, and the metal layer extending portion 530, formed on the inner wall of the first through-hole 350 and integrally connected to the metal layer constituting the mirror 510, is manufactured.

Figure 14:
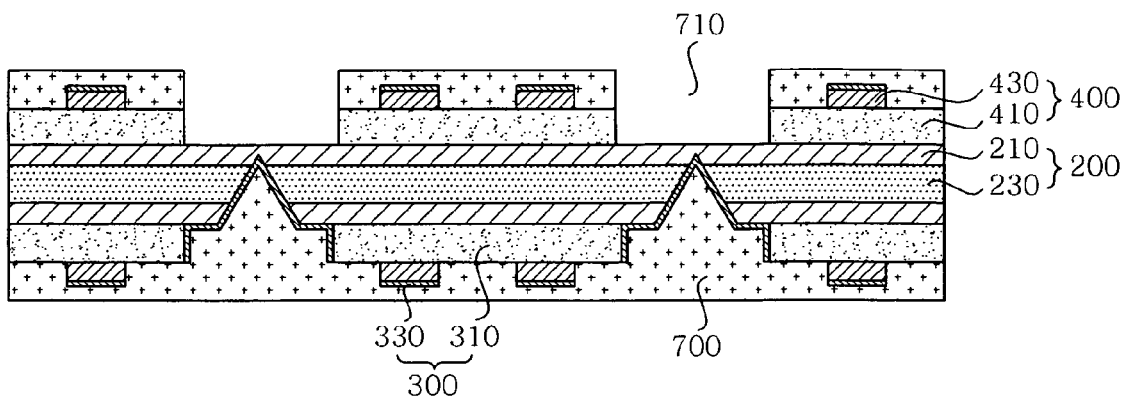
FIG. 14 is a cross-sectional view of a printed circuit board which is manufactured by additionally providing solder resist layers on outer layers of the printed circuit board shown in FIG. 13.
Figure 15:
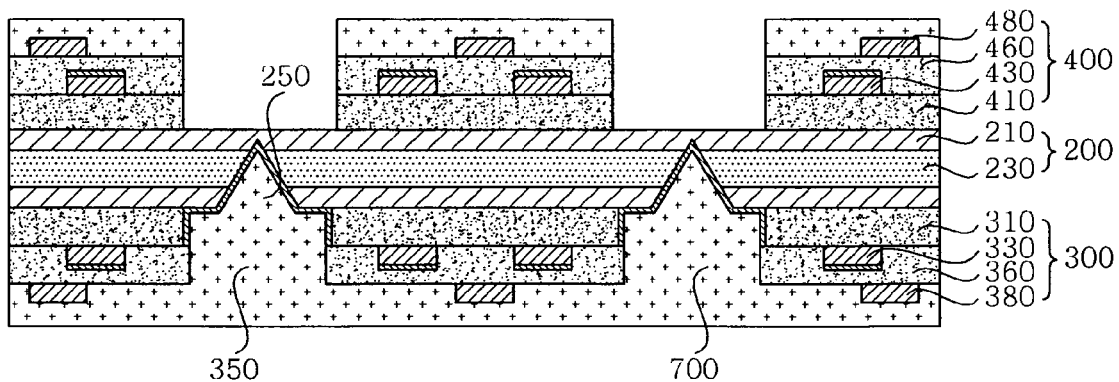
FIG. 15 is a cross-sectional view of a printed circuit board which includes first and second laminates, each of which includes two circuit layers, and solder resist layers formed on outer layers thereof.
Figure 16:
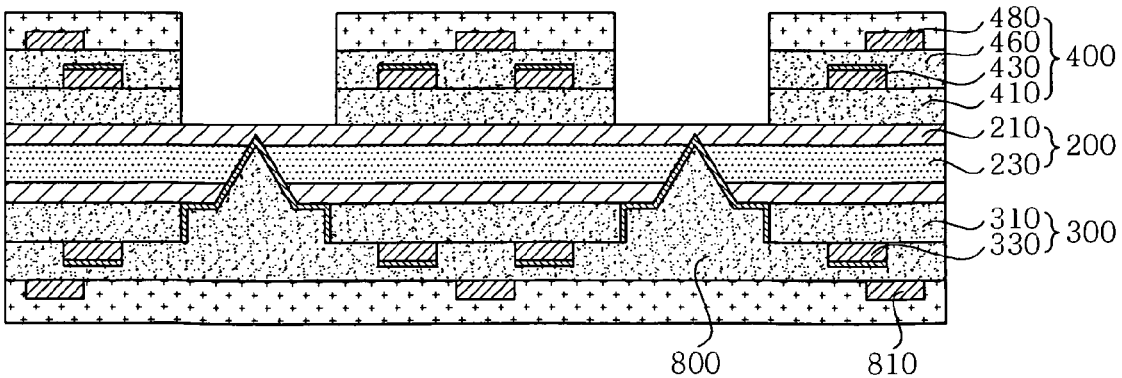
FIG. 16 is a cross-sectional view of a printed circuit board, in which a mirror notch and a first through-hole are filled with an insulating resin layer and solder resist layers are formed thereon.

FIGS. 14 to 16 are cross-sectional views of printed circuit boards, which are manufactured by further conducting additional separate processes on the printed circuit board shown in FIG. 13. These additional processes will now be respectively described.

FIG. 14 is a cross-sectional view of a printed circuit board in which a solder resist layer 700 is additionally formed on the outer layer of the printed circuit board shown in FIG. 13. The solder resist layer 700 may be created by forming a solder resist film and then etching the solder resist film. In addition to this way, various processes such as a screen printing process, a roller coating process, a curtain coating process and a spray coating process may be carried out in the formation of the solder resist layer 700.

FIG. 15 is a cross-sectional view of a printed circuit board which includes a solder resist layer 700 formed on the first and second laminates 300 and 400, each having two circuit layers. The first laminate 300 is constructed in a manner such that a third insulating layer 360 is formed on the first insulating layer 310 and the first copper layer 330 of the printed circuit board shown in FIG. 13, and then a circuit pattern comprised of a third copper layer 380 is formed. Similarly to the first laminate 300, the second laminate 400 is constructed in a manner such that a fourth insulating layer 460 is formed on the second insulating layer 410 and the second copper layer 430 of the printed circuit board shown in FIG. 13, and then a circuit pattern comprised of a third copper layer 480 is formed. After the completion of the first and second laminates 300 and 400, the solder resist layer 700 is formed in the above-described manner, thus providing the printed circuit board shown in FIG. 15.

FIG. 16 is a cross-sectional view of a printed circuit board in which the mirror notch 250 and the first through-hole 350 are filled with an insulating resin layer 800. The printed circuit board may be manufactured by forming the insulating resin layer 800 on the first laminate 300 of the printed circuit board shown in FIG. 13, forming a circuit pattern on the insulating resin layer 800, conducting the above-described process of forming two circuit layers included in the second laminate 400, and providing a solder resist layer 700.

In the manufacturing method according to the embodiment of the present invention, since the mirror 510 is formed using an electroless plating process, manufacturing costs are reduced and productivity is improved, compared to the case in which a conventional sputter process is used. Further, when a chemical plating process is conducted, since fine particles having a particle diameter of several tens of nanometers (nm) or less can be applied to the mirror surface, it is possible to achieve reflectivity superior to that resulting from a metal paste printing process.

As described above, since the printed circuit board including an optical waveguide according to the present invention includes a metal layer extending portion integrally connected to a metal layer constituting a mirror, the printed circuit board is advantageous in that it can transmit optical signals using the mirror, which has relatively high reflectivity per unit cost.

Furthermore, since the method of manufacturing a printed circuit board according to the present invention creates the mirror using electroless plating which is typically used in a process of manufacturing general printed circuit boards, the method of the present invention is advantageous in that it is suitable for the manufacture of printed circuit boards having a large area, the mirror has high reflectivity, and material consumption is efficient.

Although the preferred embodiment of the present invention has been disclosed for illustrative purposes, those skilled in the art will appreciate that various modifications, additions and substitutions are possible, without departing from the scope and spirit of the invention as disclosed in the accompanying claims. Accordingly, such modifications, additions and substitutions should also be understood to fall within the scope of the present invention.

What is claimed is:

1. A printed circuit board including an optical waveguide, comprising:
    a mirror to reflect optical signals, which is formed in the optical waveguide and is comprised of a metal layer;
    a first laminate formed on a side of the optical waveguide and including a first insulating layer having a first through-hole through which a reflecting surface of the mirror is exposed;
    a second laminate including a second insulating layer formed on the other side of the optical waveguide; and
    a metal layer extending portion formed on an inner wall of the first through-hole and integrally connected to the metal layer,
    wherein the optical waveguide comprises clads and a core disposed between the clads to transmit optical signals.

2. The printed circuit board according to claim 1, wherein the second insulating layer is made of a transparent insulating material.

3. A printed circuit board including an optical waveguide, comprising:
    a mirror to reflect optical signals, which is formed in the optical waveguide and is comprised of a metal layer;
    a first laminate formed on a side of the optical waveguide and including a first insulating layer having a first through-hole through which a reflecting surface of the mirror is exposed;
    a second laminate including a second insulating layer formed on the other side of the optical waveguide; and
    a metal layer extending portion formed on an inner wall of the first through-hole and integrally connected to the metal layer,
    wherein each of the first and second laminates is a single-sided or multilayered printed circuit board.

4. The printed circuit board according to claim 1, wherein the second laminate comprises a second through-hole formed at a region corresponding to the first through-hole so as to allow optical signals to enter and exit therethrough.

5. A printed circuit board including an optical waveguide, comprising:
    a mirror to reflect optical signals, which is formed in the optical waveguide and is comprised of a metal layer;
    a first laminate formed on a side of the optical waveguide and including a first insulating layer having a first through-hole through which a reflecting surface of the mirror is exposed;
    a second laminate including a second insulating layer formed on the other side of the optical waveguide;
    a metal layer extending portion formed on an inner wall of the first through-hole and integrally connected to the metal layer; and
    solder resist layers, which are respectively formed on the first laminate, having the first through-hole therein, and the second laminate.

6. The printed circuit board according to claim 5, wherein the solder resist layer formed on the second laminate comprises a through-hole formed at a region corresponding to the first through-hole so as to allow optical signals to enter and exit therethrough.

7. The printed circuit board according to claim 1, further comprising an insulating resin layer formed on the first laminate including the first through-hole, and a circuit pattern formed on the insulating resin layer.

8. The printed circuit board according to claim 1, wherein each of the metal layer and the metal layer extending portion comprises an electroless plating layer.

9. A method of manufacturing a printed circuit board including an optical waveguide, comprising:
    preparing an optical waveguide having a mirror notch, which comprises a first laminate including a first insulating layer formed on a side of the optical waveguide and a second laminate including a second insulating layer formed on the other surface of the optical waveguide, in which the first insulating layer has a first through-hole through which the mirror notch is exposed, and clads and a core disposed between the clads to transmit optical signals; and
    providing the mirror notch with a metal layer serving as a mirror surface for reflecting optical signals, the providing the mirror surface comprising conducting electroless plating on inner walls of the first through-hole and the mirror notch.

10. A method of manufacturing a printed circuit board including an optical waveguide, comprising:
    preparing an optical waveguide having a mirror notch, which comprises a first laminate including a first insulating layer formed on a side of the optical waveguide and a second laminate including a second insulating layer formed on the other surface of the optical waveguide, in which the first insulating layer has a first through-hole through which the mirror notch is exposed, and clads and a core disposed between the clads to transmit optical signals;
    conducting chemical or plasma pretreatment on an inner walls of the first through-hole and the mirror notch so as to improve plating properties; and providing the mirror notch with a metal layer serving as a mirror surface for reflecting optical signals.

11. A method of manufacturing a printed circuit board including an optical waveguide, comprising:
   preparing an optical waveguide having a mirror notch, which comprises a first laminate including a first insulating layer formed on a side of the optical waveguide and a second laminate including a second insulating layer formed on the other surface of the optical waveguide, in which the first insulating layer has a first through-hole through which the mirror notch is exposed, and clads and a core disposed between the clads to transmit optical signals; and
   providing the mirror notch with a metal layer serving as a mirror surface for reflecting optical signals,
   wherein the preparing the optical waveguide comprises
   providing the optical waveguide;
   placing the first laminate, including the first insulating layer having the first through-hole, on the one side of the optical waveguide, and placing the second laminate, including the second insulating layer, on the other side of the optical waveguide; and
   forming the mirror notch in a portion of the optical waveguide that is exposed through the first through-hole.

12. The method according to claim 9, wherein the preparing the optical waveguide comprises:
   forming the mirror notch in the optical waveguide; and
   placing the first laminate, including the first insulating layer having the first through-hole through which the mirror notch is exposed, on the one side of the optical waveguide, and placing the second laminate, including the second insulating layer, on the other side of the optical waveguide.

13. A method of manufacturing a printed circuit board including an optical waveguide, comprising:
   preparing an optical waveguide having a mirror notch, which comprises a first laminate including a first insulating layer formed on a side of the optical waveguide and a second laminate including a second insulating layer formed on the other surface of the optical waveguide, in which the first insulating layer has a first through-hole through which the mirror notch is exposed; and
   providing the mirror notch with a metal layer serving as a mirror surface for reflecting optical signals,
   wherein each of the first and second laminates is a single-sided or multilayered printed circuit board.

14. The method according to claim 9, wherein the second insulating layer is made of a transparent insulating material.

15. A method of manufacturing a printed circuit board including an optical waveguide, comprising:
   preparing an optical waveguide having a mirror notch, which comprises a first laminate including a first insulating layer formed on a side of the optical waveguide and a second laminate including a second insulating layer formed on the other surface of the optical waveguide, in which the first insulating layer has a first through-hole through which the mirror notch is exposed;
   providing the mirror notch with a metal layer serving as a mirror surface for reflecting optical signals; and
   after the providing the mirror surface, forming solder resist layers on the first and second laminates such that the mirror notch and the first through-hole, communicating with the mirror notch, are filled with the solder resist layer.

16. A method of manufacturing a printed circuit board including an optical waveguide, comprising:
   preparing an optical waveguide having a mirror notch, which comprises a first laminate including a first insulating layer formed on a side of the optical waveguide and a second laminate including a second insulating layer formed on the other surface of the optical waveguide, in which the first insulating layer has a first through-hole through which the mirror notch is exposed;
   providing the mirror notch with a metal layer serving as a mirror surface for reflecting optical signals; and
   after the providing the mirror surface, forming a insulating resin layer on the first laminate such that the mirror notch and the first through-hole, communicating with the mirror notch, are filled with the insulating resin layer.

* * * * *

UNITED STATES PATENT AND TRADEMARK OFFICE
CERTIFICATE OF CORRECTION

PATENT NO. : 7,672,547 B2  Page 1 of 1
APPLICATION NO. : 12/216995
DATED : March 2, 2010
INVENTOR(S) : Sang Hoon Kim It is certified that error appears in the above-identified patent and that said Letters Patent is hereby corrected as shown below:

Column 11, Lines 35-41 to Column 12, Lines 1-7, claim 13, change
"13. A method of manufacturing a printed circuit board including an optical waveguide, comprising:
preparing an optical waveguide having a mirror notch, which comprises a first laminate including a first insulating layer formed on a side of the optical waveguide and a second laminate including a second insulating layer formed on the other surface of the optical waveguide, in which the first insulating layer has a first through-hole through which the mirror notch is exposed; and
providing the mirror notch with a metal layer serving as a mirror surface for reflecting optical signals,
wherein each of the first and second laminates is a single-sided or multilayered printed circuit board." to
--13. The method according to claim 9, wherein each of the first and second laminates is a single-sided or multilayered printed circuit board.--.

Signed and Sealed this
Twenty-eighth Day of December, 2010

David J. Kappos
*Director of the United States Patent and Trademark Office*